(12) United States Patent
Booth

(10) Patent No.: US 11,555,839 B2
(45) Date of Patent: Jan. 17, 2023

(54) RATE OF CHANGE OF POWER ELEMENT AND ENTER SERVICE SUPERVISION METHOD

(71) Applicant: Schweitzer Engineering Laboratories, Inc., Pullman, WA (US)

(72) Inventor: Luke P. Booth, Charlotte, NC (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 113 days.

(21) Appl. No.: 16/946,181

(22) Filed: Jun. 9, 2020

(65) Prior Publication Data
US 2021/0382096 A1 Dec. 9, 2021

Related U.S. Application Data

(60) Provisional application No. 63/034,668, filed on Jun. 4, 2020.

(51) Int. Cl.
*G01R 21/133* (2006.01)
*G05B 23/02* (2006.01)

(52) U.S. Cl.
CPC ....... *G01R 21/133* (2013.01); *G05B 23/0291* (2013.01)

(58) Field of Classification Search
CPC .......................... G01R 21/133; G05B 23/0291
See application file for complete search history.

(56) References Cited

U.S. PATENT DOCUMENTS

| 6,697,951 | B1* | 2/2004 | Sinha | H02J 13/0086 |
| | | | | 713/300 |
| 7,898,112 | B2* | 3/2011 | Powell | H02J 3/42 |
| | | | | 307/85 |
| 8,346,402 | B2 | 1/2013 | Guzman-Casillas | |
| 9,568,516 | B2 | 2/2017 | Gubba Ravikumar | |
| 9,798,342 | B2 | 10/2017 | Gubba Ravikumar | |
| 9,906,041 | B2 | 2/2018 | Ravikumar | |
| 9,912,158 | B2 | 3/2018 | Ravikumar | |
| 10,333,301 | B2 | 6/2019 | Gubba Ravikumar | |
| 10,381,835 | B1 | 8/2019 | Gubba Ravikumar | |
| 10,476,268 | B2 | 11/2019 | Gubba Ravikumar | |

(Continued)

FOREIGN PATENT DOCUMENTS

KR  101506530 B1 * 3/2015

OTHER PUBLICATIONS

Mulhausen, John; Schaefer, Joe; Mynam, Mangapathirao; Guzman, Armando; Donolo, Marcos: "Anti-Islanding Today, Successful Islanding in the Future" Oct. 2009.

(Continued)

*Primary Examiner* — Santosh R Poudel
(74) *Attorney, Agent, or Firm* — Jared L. Cherry

(57) ABSTRACT

The present disclosure relates to a recloser control that monitors compliance of a standard for distributed energy resources (DERs). For example, a method includes obtaining power system measurements between a microgrid and an area electronic power system (EPS). The method includes determining a rate of change of power (RoCoP) based on the power system measurements. The method includes determining that a DER exceeded a threshold of the area EPS based at least in part on the RoCoP. The method includes sending a signal indicating that the DER has violated the threshold.

18 Claims, 5 Drawing Sheets

(56) References Cited

U.S. PATENT DOCUMENTS

| | | | |
|---|---|---|---|
| 10,644,493 B2 | 5/2020 | Gubba Ravikumar | |
| 10,739,414 B2 | 8/2020 | Gubba Ravikumar | |
| 10,833,507 B2 | 11/2020 | Manson | |
| 2017/0117708 A1* | 4/2017 | Wang | H02J 3/00 |
| 2017/0214070 A1* | 7/2017 | Wang | G01R 31/3835 |
| 2018/0316175 A1* | 11/2018 | Gubba Ravikumar | H02H 1/0007 |
| 2019/0052088 A1* | 2/2019 | Johansson | H02J 3/381 |
| 2020/0051677 A1* | 2/2020 | Harrison | G06F 3/0483 |
| 2020/0310404 A1* | 10/2020 | Weyl | G05B 19/048 |
| 2020/0322813 A1* | 10/2020 | Jia | H04W 24/10 |
| 2020/0350761 A1* | 11/2020 | Wang | H02H 1/0007 |

OTHER PUBLICATIONS

Hamilton, E. Roy; Undrill, John; Hamer, Paul S.; Manson, Scott: "Considerations for Generation in an Islanded Operation" Sep. 2009.

Gubba Ravikumar, Krishnanjan; Upreti, Ashish; Nagaranjan, Adithiya: "State-of-the-Art Islanding Detection and Decoupling Systems for Utility and Industrial Power Systems" Apr. 29-May 1, 2015.

Manson, Scott M.; Upreti, Ashish; Thompson, Michael J.: "Case Study: Smart Automatic Synchronization in Islanded Power Systems" Mar. 2013.

Dilliot, John; Upreti, Ashish; Nayak, Bharath; Gubba Ravikumar, Krishnanjan: "Microgrid Control System Protects University Campus From Grid Blackouts" Oct. 16-18, 2018.

Gubba Ravikumar, Krishnanjan; Upreti, Ashish; Srivastava, Anurag K.: "Zero-Setting Algorithm for High-Speed Open Line Detection Using Synchrophasors" Apr. 16-19, 2018.

\* cited by examiner

| Watts | Rate of Change | Consecutive Average | Consecutive Average |
|---|---|---|---|
| 0 – 50 kW | 50 kW / sec | 75 kW / sec | 87.5 kW / sec |
| 50 – 150 kW | 100 kW / sec | | |
| 150 – 225 kW | 75 kW / sec | 125 kW / sec | 112 kW / sec |
| 225 – 400 kW | 175 kW / sec | | |
| 400 – 450 kW | 50 kW / sec | | |

RATE OF CHANGE OF POWER ELEMENT AND ENTER SERVICE SUPERVISION METHOD

RELATED APPLICATION

This application claims priority to U.S. Provisional Patent Application No. 63/034,668, filed Jun. 4, 2020, the entirety of which is incorporated herein by reference.

TECHNICAL FIELD

The present disclosure relates generally to distributed energy resources (DERs) in electric power systems and, more particularly, to monitoring rate of change of power (RoCoP) of DERs when entering service.

BRIEF DESCRIPTION OF THE DRAWINGS

Non-limiting and non-exhaustive embodiments of the disclosure are described herein, including various embodiments of the disclosure with reference to the figures listed below.

FIG. 3 is a table showing rate of change of power and consecutive averages during an enter service period of a distributed energy resource (DER) of the microgrid of FIG. 1, in accordance with an embodiment.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Electric power delivery systems may include microgrids that may be electrically connected to an area electric power system (EPS), such as a utility grid, to allow the microgrid to provide or receive power from the area EPS. Further, the microgrid may include various distributed energy resources (DERs), such as distributed generators, that provide power to loads on the microgrid to allow the microgrid to operate independently of the area EPS.

DERs may begin to connect to the area EPS during an enter service period. The enter service period refers to a time in which the DER is ready to connect to the area EPS and has started to connect to the area EPS. During the enter service period, utilities may request that DERs follow certain processes to reduce unexpected stresses or disturbances on the area EPS. For example, utilities may request that DERs ramp the amount of power provided to the utility over a period of time to reduce stress on the area EPS.

However, control systems of DERs may not respond according to the enter service period processes expected by utilities. For example, control systems of DERs may not be updated with settings to meet changes to the enter service period process. Alternatively, some DERs may be misconfigured for meeting the enter service expectations. Accordingly, there is a need to ensure that DERs comply with enter service period expectations of utilities.

Figure 1:
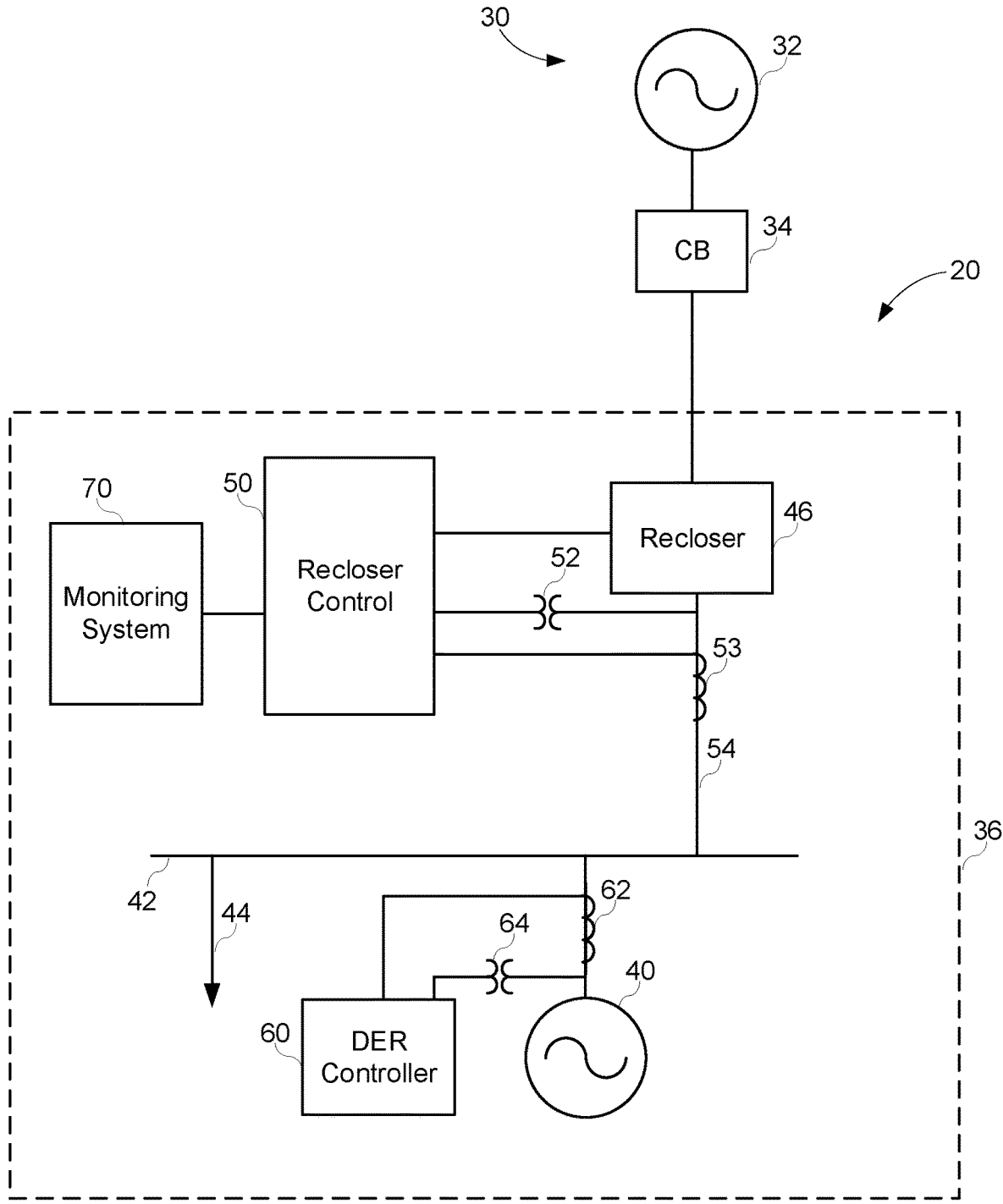
FIG. 1 is a one-line diagram of an electric power delivery system having a monitoring system that monitors a microgrid that connects to an area electric power system (EPS) via a recloser control, in accordance with an embodiment.

FIG. 1 illustrates a one-line diagram of an embodiment of an electric power delivery system, in accordance with an embodiment. The electric power delivery system includes an area EPS 30, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the area EPS includes a generator 32, representative of an electric utility, and a circuit breaker 34.

In the illustrated embodiment, the area EPS 30 30 is electrically connected to a microgrid 36. The microgrid 36 may include various electrical equipment as described above. As illustrated, the microgrid 36 includes a distributed generator 40, a bus 42, one or more loads 44, and a recloser 46. The recloser 46 may operate at a point of common coupling (PCC) on a power line 54 between the microgrid 36 and the area EPS 30. For instance, the recloser 46 may be located on an overhead power distribution line that enters the microgrid 36. The microgrid 36 may further include a recloser control 50 communicatively coupled to the recloser 46 to send control signals to the recloser 46. Further, the recloser control 50 may receive signal(s) from one or more sensors. For instance, the recloser control 50 may receive voltage signal(s) from a potential transformer 52 indicating the voltage of the power line 54 and receive current signal(s) from a current transformer 53 indicating current of the power line 54.

The recloser control 50 may detect events on the power line 54 based on the voltage signals, current signals, and the like. For instance, a transient fault may occur on the overhead power distribution line of the recloser 46. The recloser control 50 may detect the transient event (e.g., overcurrent event, undercurrent event, overvoltage event, undervoltage event, etc.) and send a signal to the recloser 46 to open (i.e., trip) the recloser 46.

The recloser control 50 may be connected to a monitoring system 70 that monitors the power system characteristics (e.g., voltage measurements, current measurements, circuit breaker statuses, etc.). The monitoring system 70 may include a human-to-machine interface (HMI) that allows an operator to provide inputs to and obtain data regarding the power system and to adjust settings of the power system.

The DER 40 may be electrically connected to the bus 42 to allow the DER 40 to provide power to the loads 44 on the microgrid 36. Further, the DER may provide additional power to the area EPS 30. As mentioned above, DERs may be expected to follow certain standards of the utility when entering service. For example, Institute of Electrical and Electronics Engineers (IEEE) 1547-2018 is a standard that utilities may expect DERs to follow. Among the criteria of the standard, the DER may be expected to prevent entering service when a permit service setting is disabled. The DER may be expected to delay entering service by an adjustable minimum delay. DERs may be expected to increase power linearly, or in a stepwise linear ramp, with an average rate-of-change not exceeding the DER nameplate active power rating divided by the enter service period. The duration of the enter service period may be adjustable over a range of 1 second to 1000 seconds with a default time (e.g., 300 second default). The maximum active power increase of any single step during the enter service period may be expected to be less than or equal to 20% of the DER nameplate active power rating. Where a stepwise ramp is used, the rate of change over the period between any two consecutive steps may not exceed the average rate-of-change over the full enter service period. This is a maximum ramp rate and the DER may increase output slower than specified. Note that these are examples of the IEEE 1547-2018 standard, and the conditions for entering service may depend on the standard and the power system implementation.

A DER controller 60 may monitor the voltage and/or current output of the DER 40 via sensors, such as current transformer(s) 62 and potential transformer(s) 64. The DER controller 60 may control real power output of the DER 40 by controlling, for example, fuel inputs, to the DER 40. As another example, the DER controller 60 may control an excitation controller of the DER 40 as the DER 40 is entering service to control increases in reactive power output of the DER 40 onto the microgrid 36 and area EPS 30.

As mentioned above, some DER controllers may be misconfigured, pre-date adoption of a standard, or may otherwise allow the DER to exceed the boundaries of the standard adopted by the utilities. Accordingly, there is a need for improved monitoring of power systems to comply with standards of utilities, such as the IEEE 1547-2018 standard, to reduce stress on the power system during the enter service period. As such, utilities, such as the area EPS 30, may ensure that a DER is complying with the standard the utility desires.

The recloser control 50 may be used to monitor electrical characteristics on the microgrid 36 caused by the output of the DER 40 to ensure that the DER 40 is complying with the standard. For example, the recloser control 50 may obtain voltage measurements and current measurements and determine a rate of change of power (RoCoP) between steps. If the RoCoP exceeds a threshold specified by the standard, the recloser control 50 may provide a notification indicating that the standard was exceeded.

Figure 2:
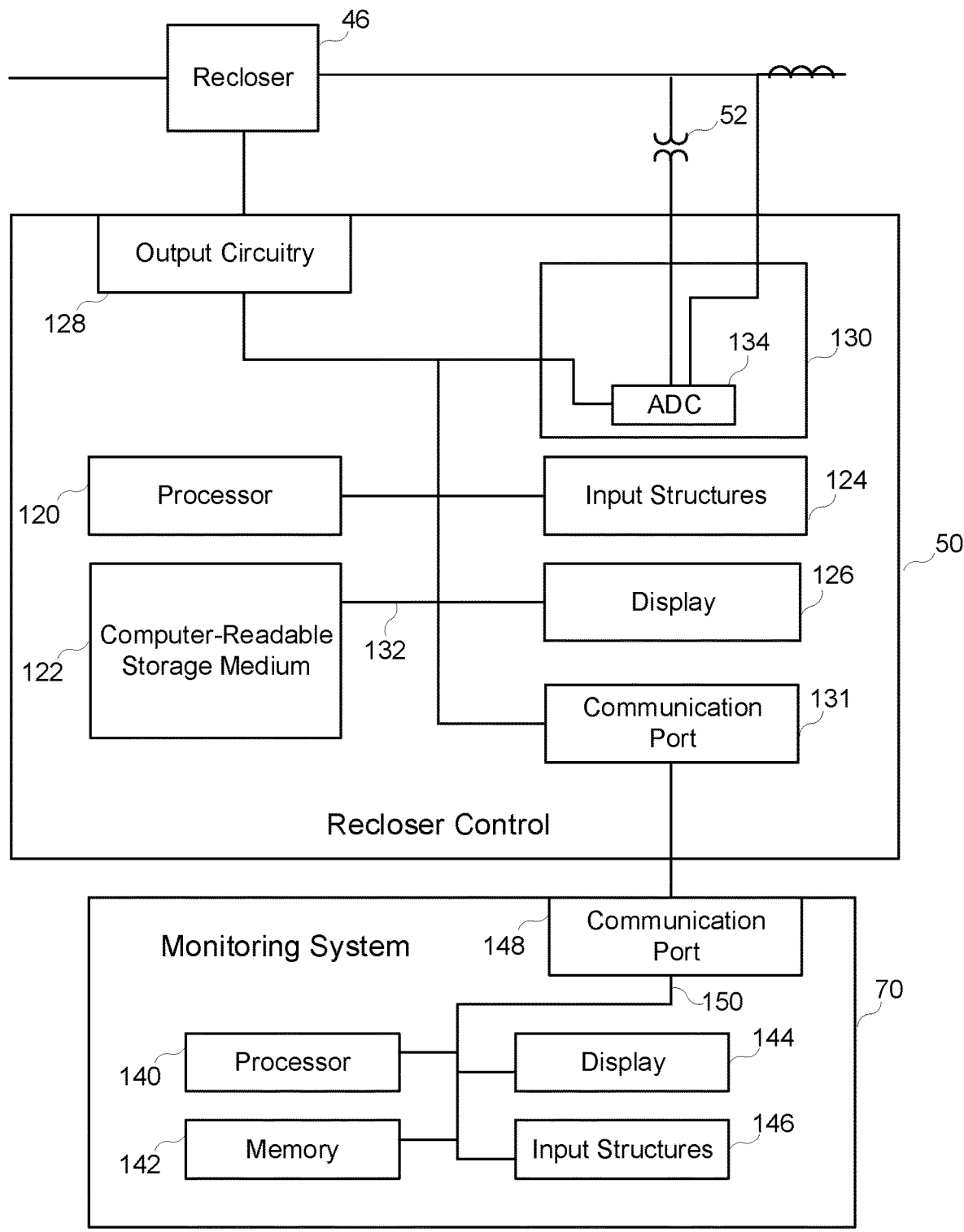
FIG. 2 is a block diagram of the recloser control and the monitoring system of FIG. 1, in accordance with an embodiment.

FIG. 2 is a block diagram of an embodiment of the recloser control 50 and the monitoring system 70. In the illustrated embodiment, the recloser control 50 includes a processor 120, a computer-readable storage medium 122, input structures 124, a display 126, output circuitry 128, sensor circuitry 130, and one or more communication port(s) 131.

The recloser control 50 may include one or more bus(es) 132 connecting the processor 120 or processing unit(s) to the computer-readable storage medium 122, the input structures 124, the display 126, the output circuitry 128, and/or the sensor circuitry 130. The computer-readable storage medium 122 be embodied as memory, such as random access memory (RAM), read only memory (ROM), or a combination thereof, and may include or interface with software, hardware, or firmware modules for implementing various portions of the systems and methods described herein. The computer-readable storage medium 122 may be the repository of one or more modules and/or executable instructions configured to implement any of the processes described herein.

The processor 120 may process inputs received via the sensor circuitry 130 and the communication ports 131. The processor 120 may operate using any number of processing rates and architectures and may be configured (e.g., programmed) to perform various algorithms and calculations described herein using computer executable instructions stored on computer-readable storage medium 122. The processor 120 may be embodied as a microprocessor. In certain embodiments, the processor 120 and/or the computer-readable storage medium 122 may be embodied as discrete electrical components, a general purpose integrated circuit, one or more Application Specific Integrated Circuits ("ASICs"), a Field Programmable Gate Array ("FPGA"), and/or other programmable logic devices. The processor 120 and/or the computer-readable storage medium 122 may be referred to generally as processing circuitry.

The sensor circuitry 130 may receive voltage signals from the voltage transformer 52 and current signals from the current transformer, transform the signals to a level that may be sampled, and sample the signals using, for example, A/D converter(s) 134 to produce digital signals representative of measured voltage on the power line 54. Similar values may also be received from other distributed controllers, station controllers, regional controllers, or centralized controllers. The values may be in a digital format or other format. In certain embodiments, the sensor circuitry 130 may be utilized to monitor current and/or voltage signals associated with a portion of an electric power delivery system 20. Further, the sensor circuitry 130 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 134 may be connected to the processor 120 by way of the bus 132, through which digitized representations of voltage signals may be transmitted to the processor 120. As described above, the processor 120 may be used to monitor and/or protect portions of the electric power delivery system 20, and issue control instructions in response to the same (e.g., instructions implementing protective actions).

The output circuitry 128 may include one or more output connectors (e.g., output contacts) that electrically connect the recloser control 50 to the recloser 46 to allow the processor 120 to send control signals to the recloser 46. For example, the output circuitry 128 may convert bus signals from the processor 120 to a voltage and/or current to open or close the recloser 46.

The communication port(s) 131 may include, for example, a wireless/wired transceiver that communicates with one or more other IEDs, a central monitoring station, and the like. The recloser control 50 may include a display screen 126 that displays information to notify an operator of events on the electric power delivery system 20, such as open circuit conditions. In certain embodiments, the processor 120 may effect a control operation on the electric power delivery system 20 via the output circuitry 128, as described above. For example, the processor 120 may send a signal to open the recloser 46 upon detecting islanding of the microgrid 36 to disconnect the power line 56 between the PCC and the area EPS 30.

The monitoring system 70 may include similar components (e.g., processor 140, computer-readable storage medium 142, display 144, input structures 146, and communication port(s) 148 connected via one or more buses 150) with similar functions to those described above with respect to the recloser control 50. As illustrated, the monitoring system 70 and the recloser control 50 may be communicatively coupled via a communication medium (e.g., ethernet, fiber optic, etc.) between the communication ports 131 and 148. While the monitoring system 70 and the recloser control 50 are illustrated as being directly communicatively coupled, in other embodiments, communication may be routed via a switched network, a wireless network, or any other suitable method. Further, while the monitoring system 70 and the recloser control 50 are illustrated as separate devices, in other embodiments, the monitoring system 70 may be incorporated wholly or partially into the recloser control 50 depending on the implementation. As an example, the monitoring system 70 may be embodied as an SEL-3530 real time automation controller (RTAC), commercially available from Schweitzer Engineering Laboratories Inc. of Pullman, Wash.

The monitoring system 70 may monitor and control various electronic devices on the microgrid 36. For example, the monitoring system 70 may send signal(s) to the recloser control to cause the recloser control to trip or close the recloser 46 depending on the characteristics of the microgrid 36 and/or the area EPS 30.

As mentioned above, the monitoring system 70 may determine whether the DER 40 of the microgrid 36 complies with a standard during an enter service period of the microgrid 36. The monitoring system 70 may receive user inputs of the enter service period, the nameplate capacity of the DER, and other settings.

FIG. 3 is a table 170 of step changes of the DER 40 during an enter service period. To begin the enter service period, the recloser control 50 may close the recloser 46 thereby connecting the microgrid 36 to the area EPS 30. Further, the DER 40 may be generating electrical energy and may begin to be brought on-line. For example, some DERs may be connected to the microgrid via a voltage regulator, between the DER 40 and the bus 42, that gradually ramps up or down the electrical power supplied to the microgrid 36 during the enter service period. By regulating the flow of current and/or voltage, the voltage regulator of the DER 40 may linearly increase the electrical power supplied or may increase the electrical power supplied in step changes. Although a voltage regulator is used as an example, the entering service process of increasing power supplied may depending on the type of DER. For example, the real power increase or decrease of DERs that have prime movers may be controlled by a governor. This governor controls fuel input to the prime mover. This fuel may be diesel, or steam, or water, etc. Furthermore, the governor may be controlled by an Automatic Generation controller that may be capable of ramping up or down the real power at a certain rate. Not all prime movers would necessarily have this capability though. Inverter sources are another type of DERs. Inverters may have controllers that increase and decrease real power using power electronics.

In the illustrated embodiment, a one second interval is used between steps. In the first second, the monitoring system 70 may calculate the rate of change of power (RoCoP) over the first step as being 50 kW/sec due to the DER increasing power output from 0 to 50 kilowatts (kW) over a first step. To ensure that the DER is complying with the standard, the monitoring system 70 may compare the single step to a percentage of the nameplate active power rating of the DER. For example, under the IEEE 1547-2018 standard, the single step is expected to be below 20% of the nameplate active power rating of the DER 40. In this example, the DER 40 may be rated to generate 1 Megawatt (MW), and thus, the single step is not greater than the set percentage.

The monitoring system 70 may calculate the RoCoP over a second step from 50 kW to 150 kW as being 100 kW/sec. Similarly, the single step of 100 kW/sec is not greater than the set percentage of the DER nameplate active power rating. The monitoring system 70 may calculate a consecutive average of power increase between the first step (0-50 kW) and the second step (50-150 kw) over the first two seconds as 75 kW/sec. In this example, the enter service period of the DER 40 may be set to 10 seconds such that the average RoCoP for each second over the full enter service period is 100 kW. The monitoring system 70 may determine that the consecutive average RoCoP of 75 kW/sec is less than the average RoCoP over the full enter service period, thus complying with the standard.

As illustrated, the DER 40 continues to ramp up power output from 150 kW to 225 kW having a RoCoP of 75 kW/sec. The monitoring system 70 may again compare the rate of change of power to the threshold based on the nameplate active power rating. Further, the monitoring system 70 may calculate the consecutive average over the two seconds as being 87.5 kW/sec, thereby complying with the standard.

The DER 40 may continue to ramp up power output from 225 kW to 400 kW with an RoCoP of 175 kW/sec. The monitoring system 70 may determine the consecutive average as being 125 kW/sec, which exceeds an average RoCoP threshold over the full enter service period (100 kW/sec). Because the consecutive RoCoP average exceeds the average RoCoP threshold, the monitoring system 70 may send a signal indicating that the DER has violated the threshold. The signal may be a display signal sent to a display of the monitoring system 70 to alert an operator of the violation. In some embodiments, the monitoring system 70 may send the signal to the recloser control 50 to allow the recloser control 50 to perform protective operations based on the violation (e.g., opening the recloser 46).

Following the violation, in some embodiments, the monitoring system 70 may continue to monitor the DER 40 for compliance with the standard to count the number of violations. Upon exceeding a threshold number of violations, the monitoring system 70 may send a signal to cause the recloser control 50 to issue a lockout command, thereby opening the recloser 46 until an operator resets the recloser 46.

Figure 4:
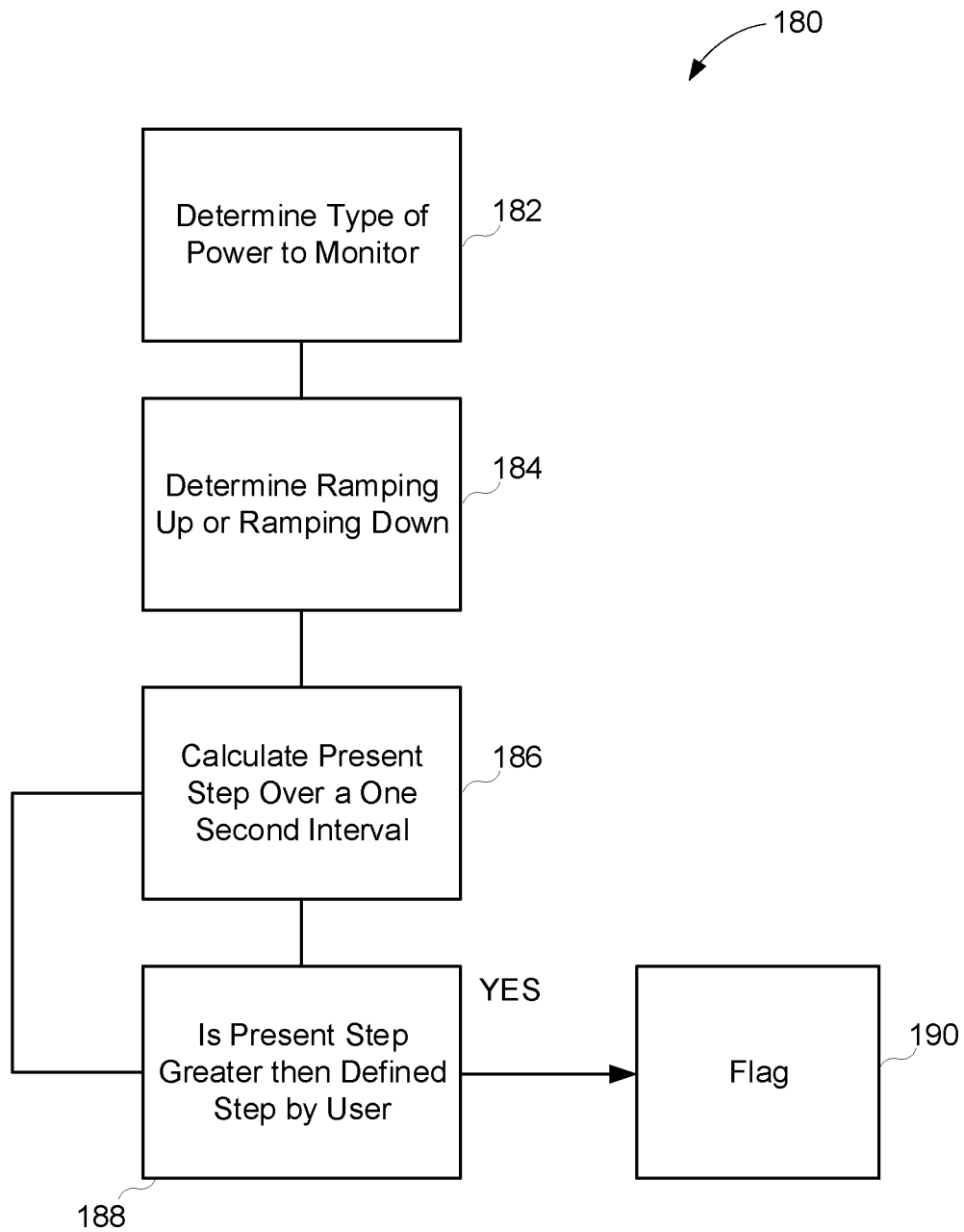
FIG. 4 is a flow diagram of a process performed by the monitoring system of FIG. 1 based on measurements from the recloser control to calculate the rate of change of power, in accordance with an embodiment.

FIG. 4 is a flow diagram of a process that may be performed by the monitoring system 70. The processor 140 of the monitoring system 70 may be configured (e.g., programmed) to execute instructions stored on the memory 142 (e.g., code) to perform the operations described in conjunction with FIGS. 3-5. The processor 140 may determine a type of power to monitor (block 182). For example, the type of power may refer to real or reactive power and will be capable of monitoring power flow direction. Once the type of power to be monitored and power flow direction is selected, the process would then monitor whether power is ramping up or ramping down.

The processor 140 may receive voltage measurements and current measurements from the recloser control 50 obtained via the potential transformer 52 and the current transformer 53 at the PCC. The processor 140 may determine whether power output of the DER 40 is ramping up or ramping down (block 184). The processor 140 may calculate a first power value of the DER 40 based on the voltage measurements and current measurements obtained at a first time. The processor 140 may calculate a second power value of the DER 40 based on the voltage measurements and current measurements obtained at a second time. The processor 140 may then calculate a present step RoCoP over a time interval between the second time and the first time. The time interval may be $\frac{1}{32}$ second, $\frac{1}{16}$ second, $\frac{1}{8}$ second, $\frac{1}{4}$ second, $\frac{1}{2}$ second, 1 second, 2 seconds, 3 seconds, 4 seconds, or the like.

The processor 140 may then compare whether the present step RoCoP is greater than a threshold defined by the operator. Upon exceeding the threshold, the processor 140 may send a signal indicating that the that the standard was violated (block 190).

Figure 5:
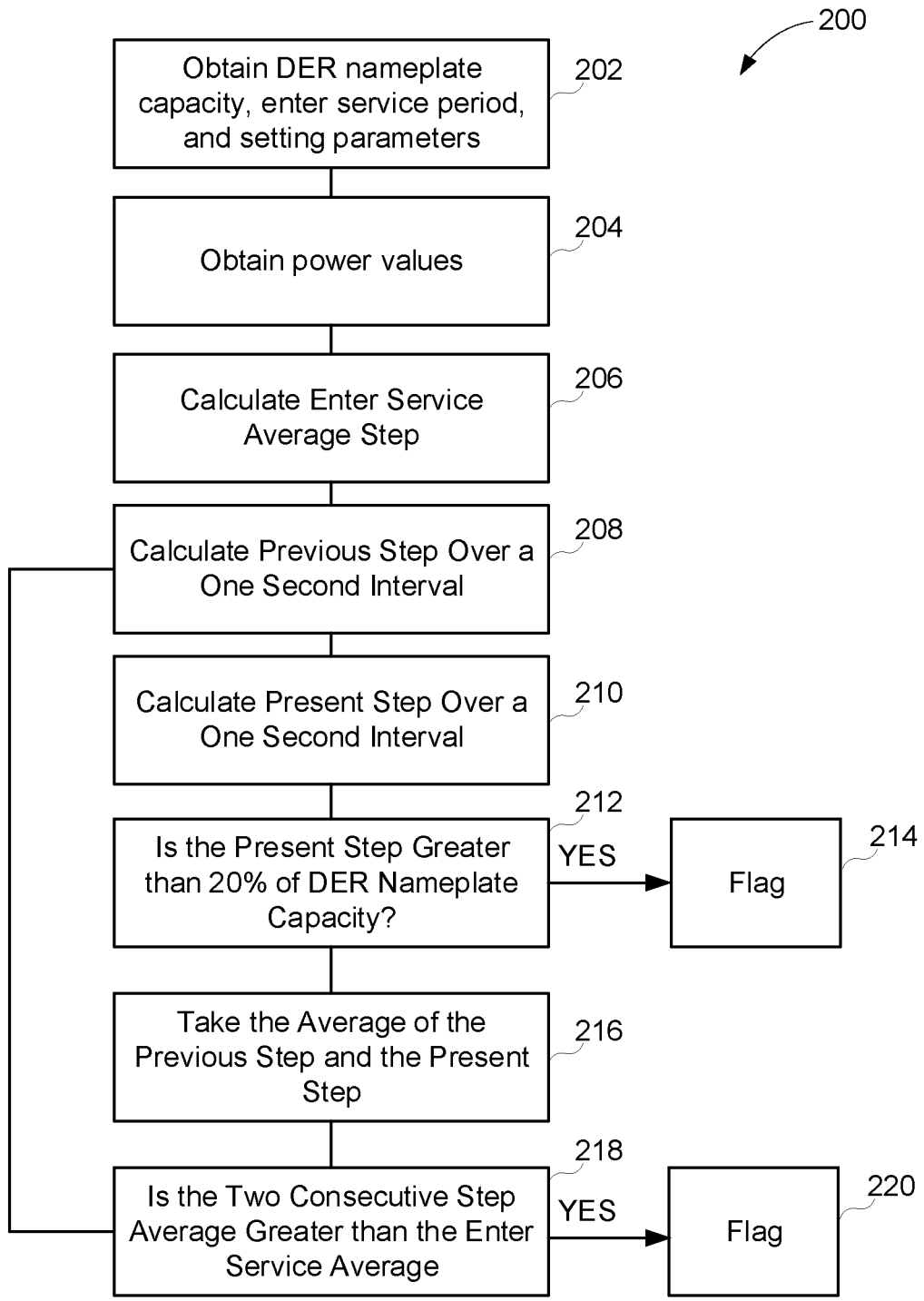
FIG. 5 is a flow diagram of a process performed by the monitoring system of FIG. 1 to determine whether the DER is complying with an enter service standard of the area EPS, in accordance with an embodiment.

FIG. 5 is a flow diagram of a process 200 that may be performed by the monitoring system 70 to ensure that the DER complies with the IEEE 1547-2018 standard. While the process 200 is used as an example of monitoring a DER for compliance with a standard, the implementation may depend on the standard being applied and the power system involved.

The process 200 may begin by obtaining the DER nameplate capacity, the enter service period, and setting parameters (block 202). These settings may be entered by an operator at the monitoring system 70 via the input structures 146, received via the communication ports 148, or the like. For example, the enter service period may be entered as an integer between 1 and 1000 with a default of 300 indicating the number of seconds over which the DER 40 enters service.

The processor 140 may obtain power values (block 204). As mentioned above, the monitoring system 70 may calculate the power values based on the current measurements and the voltage measurements from the recloser control 50 that were obtained via the current transformer and potential transformer coupled to the power line 54.

The processor 140 may calculate the enter service average step (block 206). The average may be the DER nameplate capacity divided by the number of steps. The processor 140 may calculate a first step (i.e., previous step) RoCoP over a one second interval, as described with respect to FIG. 4 (block 208). The first step may be stored in the memory 142 of the monitoring system 70.

The processor 140 may then calculate a second step RoCoP over a one second interval (block 210). The processor 140 may then determine whether the present step is greater than a threshold of 20% of the DER nameplate capacity (block 212). If the threshold is exceeded, the processor 140 may send a signal indicating that the standard was violated (block 214). If the threshold is not exceeded, the processor 140 may continue to determine whether the average RoCoP over two consecutive steps exceeds the average RoCoP over the enter service period.

The processor 140 may then determine a two consecutive step average of the previous step and the present step, as described with respect to FIG. 3 (block 216). The processor 140 may then determine whether the two consecutive step average is greater than a threshold from the enter service average (block 218). If the two consecutive step average exceeds the enter service average, the processor 140 may send a signal to notify an operator indicating that the DER 40 did not comply with the standard (block 220). If the DER 40 complied with the standard, the monitoring system 70 may continue to monitor the next step of the power system (return to block 208). In some embodiments, if the monitoring system 70 is controlled by the area EPS, the area EPS may disconnect the microgrid after a predetermined number of violations to ensure the stability of the area EPS. By ensuring that the DER complies with the standard, the monitoring system 70 can improve the reliability and stability of the area EPS.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure. For example, although the operations of FIGS. 4 and 5 are shown in a particular order, any suitable order of steps may be used. Further, other embodiments may include additional steps or fewer steps than those described.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A monitoring system, comprising:
 a communication port configured to communicatively couple the monitoring system to a recloser control between a microgrid and an area electric power system (EPS);
 a memory; and
 a processor operatively coupled to the memory, wherein the processor is configured to execute instructions stored on the memory to perform operations comprising:
  obtaining power system measurements from the recloser control;
  determining a rate of change of power (RoCoP) based on the power system measurements;
  determining that a power output of a distributed energy resource (DER) exceeds a maximum power threshold of the EPS upon connection of the DER and the EPS and during an enter service period and based at least in part on the RoCoP;
  sending a signal indicating that the DER has violated the threshold,
  wherein the threshold is established using an Institute of Electrical and Electronics Engineers (IEEE) 1547-2018 standard and comprises a maximum active power increase of a single step, and
  wherein the processor is configured to execute instructions stored on the memory to perform operations comprising comparing the RoCoP of a single step to a percentage of a nameplate active power rating of the DER as the threshold.

2. The monitoring system of claim 1, wherein the threshold is an average rate-of-change threshold over a full enter service period, and wherein the RoCoP of two consecutive steps are compared to the average rate-of-change threshold.

3. The monitoring system of claim 1, wherein the monitoring system is configured to send the signal to the recloser control to allow the recloser control to open a recloser, thereby disconnecting the DER from the area EPS.

4. The monitoring system of claim 1, wherein the processor is configured to execute instructions stored on the memory to perform operations comprising receiving a time over which an enter service period of the microgrid is set to occur via a user input.

5. The monitoring system of claim 1, wherein the monitoring system is configured to send the signal to notify an operator that the DER has violated the threshold.

6. The system of claim 1, wherein the processor is further configured to execute instructions stored on the memory to perform operations comprising:
adjusting a power output of the DER to control the RoCoP.

7. The system of claim 6, wherein adjusting the power output of the DER comprises adjusting a governor of the DER.

8. The system of claim 6, wherein adjusting the power output of the DER comprises adjusting power electronics.

9. A method, comprising:
obtaining, via one or more processors, power system measurements between a microgrid and an area electronic power system (EPS);
determining, via the one or more processors, a first rate of change of power (RoCoP) based on the power system measurements;
determining, via the one or more processors, that a power output of a distributed energy resource (DER) exceeds a maximum power threshold of the area EPS upon connection of the DER and the EPS and during an enter service period based at least in part on the first RoCoP; and
sending, via the one or more processors, a signal indicating that the DER has violated the threshold,
wherein the threshold is established using an Institute of Electrical and Electronics Engineers (IEEE) 1547-2018 standard and comprises a maximum active power increase of a single step, and
wherein the processor is configured to execute instructions stored on a memory to perform operations comprising comparing the first RoCoP of a single step to a percentage of a nameplate active power rating of the DER as the threshold.

10. The method of claim 9, comprising, sending the signal to a display to indicate that the DER has violated the threshold.

11. The method of claim 9, comprising:
receiving, via a user input, a number of violations allowed to occur by the DER; and
upon exceeding the number of violations, sending, via the one or more processors, a lock out signal to cause the microgrid to be disconnected from the area EPS.

12. The method of claim 9, wherein the power system measurements comprise current measurements and voltage measurements at a point of common coupling (PCC) between the microgrid and the area EPS.

13. The method of claim 9, comprising obtaining, via user input, a DER nameplate capacity and an enter service period of the DER.

14. The method of claim 9, further comprising:
calculating the first RoCoP over a first interval;
calculating a second RoCoP over a second interval; and
determining whether a consecutive average over the first interval and the second interval is greater than an enter service average threshold.

15. The method of claim 9, further comprising:
determining whether the DER is ramping up or ramping down;
calculating the first RoCoP over an interval based on a difference between a first power value at a start of the interval and a second power value at an end of the interval; and
determining that the first RoCoP change over the interval is greater than the threshold.

16. A system, comprising:
a recloser control subsystem configured to be disposed between a microgrid comprising a distributed energy resource (DER) and an area electric power system (EPS), the recloser control subsystem comprising:
a sensor circuit configured to receive a plurality of electrical measurements;
an output circuit configured to generate a signal operable to control a recloser; and
a first communication port; and
a monitoring subsystem, comprising:
a second communication port to communicatively couple to the first communication port;
a memory; and
a processor operatively coupled to the memory,
wherein the processor is configured to execute instructions stored on the memory to:
analyze the plurality of electrical measurements from the sensor circuit;
determine a rate of change of power (RoCoP) of the DER based on the plurality of measurements;
determine that a power output of the DER exceeds a maximum power threshold of the EPS upon connection of the DER and the EPS and during an enter service period based at least in part on the RoCoP; and
implement an action;
wherein the threshold is established using an Institute of Electrical and Electronics Engineers (IEEE) 1547-2018 standard and comprises a maximum active power increase of a single step, and
wherein the processor is configured to execute instructions stored on the memory to perform operations comprising comparing the RoCoP of a single step to a percentage of a nameplate active power rating of the DER as the threshold.

17. The system of claim 16, wherein the action comprises adjusting a power output of the DER to control the RoCoP.

18. The system of claim 16, wherein the action comprises a flag indicating that the DER has violated the threshold.

* * * * *